(12) United States Patent
Nagasaka

(10) Patent No.: US 6,458,670 B2
(45) Date of Patent: Oct. 1, 2002

(54) METHOD OF MANUFACTURING A CIRCUIT SUBSTRATE

(75) Inventor: Takashi Nagasaka, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/772,873

(22) Filed: Jan. 31, 2001

Related U.S. Application Data

(62) Division of application No. 09/128,670, filed on Aug. 4, 1998, now Pat. No. 6,201,286.

(30) Foreign Application Priority Data

Aug. 5, 1997 (JP) .............................................. 9-224281

(51) Int. Cl.⁷ .............................................. H01L 21/20
(52) U.S. Cl. ...................... 438/382; 438/238; 438/329; 438/381; 438/384
(58) Field of Search ................................ 438/238, 329, 438/381, 382, 384

(56) References Cited

U.S. PATENT DOCUMENTS

| | | | |
|---|---|---|---|
| 4,285,001 A | 8/1981 | Gerzberg et al. ............ 257/300 |
| 4,349,862 A | * 9/1982 | Bajorek et al. ............. 361/401 |
| 4,732,798 A | * 3/1988 | Ishida et al. ................ 428/137 |
| 5,254,493 A | * 10/1993 | Kumar .............. 148/DIG. 136 |
| 5,371,029 A | * 12/1994 | Abdo et al. .................... 29/846 |
| 5,593,722 A | 1/1997 | Otani et al. ................. 427/101 |
| 5,633,785 A | 5/1997 | Parker et al. ................ 361/766 |
| 5,754,004 A | * 5/1998 | Miyagawa et al. ......... 313/585 |
| 5,770,886 A | 6/1998 | Rao et al. .................... 257/533 |
| 5,847,442 A | 12/1998 | Mills, Jr. et al. ........... 257/536 |
| 5,891,795 A | 4/1999 | Arledge et al. ............. 438/613 |

FOREIGN PATENT DOCUMENTS

| | | |
|---|---|---|
| JP | 57-71160 | * 5/1982 |
| JP | 1-298796 | * 12/1989 |
| JP | 02-288290 | 11/1990 |
| JP | 06-077660 | 3/1994 |
| JP | 06-232562 | 8/1994 |

* cited by examiner

Primary Examiner—Carl Whitehead, Jr.
Assistant Examiner—Jeff Vockrodt
(74) Attorney, Agent, or Firm—Harness, Dickey & Pierce, PLC

(57) ABSTRACT

A multilayer wiring substrate has a passive circuit element disposed on an insulating base substrate, and an insulating layer is disposed on the insulating base substrate with the passive circuit element interposed therebetween. The insulating layer is formed to have via holes for exposing specific portions of the passive circuit element, and a terminal electrodes are disposed in the via holes. Accordingly, the entire area of the multilayer wiring substrate can be reduced, and cracks caused by residual stress produced by a firing step can be prevented.

28 Claims, 8 Drawing Sheets

METHOD OF MANUFACTURING A CIRCUIT SUBSTRATE

CROSS REFERENCE TO RELATED APPLICATION

This is a division of application Ser. No. 09/128,670, filed Aug. 4, 1998 now U.S. Pat. No. 6,201,286.

This application is based upon and claims the benefit of priority of the prior Japanese Patent Application No. 9-224281, filed on Aug. 5, 1997, the contents of which are incorporated herein by reference.

BACKGROUND OF THE INVENTION

1. Field of the Invention

This invention relates to a multilayer wiring substrate which is manufactured through a firing process and holds therein passive circuit elements such as a resistive element and an inductor element, and to a method of manufacturing the same.

2. Description of the Related Art

When a thick-film resistive element is formed within multilayer wiring substrate for a hybrid integrated circuit, conventionally, as shown in FIG. 12, a plurality of conductive patterns 2 including a pair of resistive element terminal electrodes 2a are formed on an insulating substrate 1 by printing and firing steps using conductive paste. Then, a thick-film resistive element 3 is formed across the pair of the terminal electrodes 2a by printing and firing steps using resistive paste. The thick-film resistive element 3 and the conductive patterns 2 are covered with a protective overcoat glass (not shown).

However, in the construction described above, the terminal electrodes 2a and the thick-film resistive element 3 are arranged in a two-dimensional state, so that a region indicated with slant lines in FIG. 12 becomes a dead space for the thick-film resistive element 3. As a result, the area necessary for arranging the thick-film resistive element 3 becomes large, resulting in increase in entire area of the substrate. To solve this problem, recently, a substrate technique for forming a multilayer wiring substrate has been adopted. An example of this kind of substrate technique will be explained referring to FIGS. 14A to 14D.

First, as shown in FIG. 14A, a plurality of conductive patterns 5 are formed on an insulating substrate 4 by printing and firing steps using conductive paste. The conductive patterns 5 includes a pair of terminal electrodes 5a for a resistive element. The insulating substrate 4 is made of inorganic material. Next, as shown in FIG. 14B, a thick-film resistive element 6 is formed to be connected to the terminal electrodes 5a on the insulating substrate 4 by printing and firing steps using resistive paste.

After that, as shown in FIG. 14C, an insulating layer 7 made of for example glass material is formed on the insulating substrate 4 to have via holes 7a for exposing the terminal electrodes 5a and parts of the conductive patterns 5. As shown in FIG. 14D, then, terminal electrodes 8 filling the via holes 7a and conductive patterns 9 disposed on the insulating layer 7 to be connected to the terminal electrodes 8 are formed by printing and firing steps using the conductive paste. Accordingly, a thick-film multilayer wiring substrate for a hybrid integrated circuit is completed. Incidentally, FIGS. 14A to 14D show the process for forming the thick-film wiring substrate having a two-layer structure in a stepwise manner; however when a thick-film multilayer wiring substrate having more than three layers is manufactured, after the printing and firing steps are carried out to form the terminal electrodes 8 and the conductive patterns 9, the steps shown in FIGS. 14A to 14D are repeatedly carried out.

In the process described above, in the firing step for the insulating layer 7, a temperature is raised to approximately 850° C.–900° C. As opposed to this, a normal temperature range of the thick-film multilayer wiring substrate is comparatively low (for example −40° C.–150° C.). Accordingly, residual stress is produced due to a difference in thermal expansion coefficient between the thick-film resistive element 6 and the insulating layer 7.

In the conventional structure, as shown in FIG. 13, the thick-film resistive element 6 swells up at overlapping portions with the terminal electrodes 5a. Therefore, the residual stress is liable to concentrate on swelling portions A of the thick-film resistive element 6 to cause cracks. Likewise, the insulating layer 7 has portions B corresponding to the swelling portions A. The portions B of the insulating layer 7 have a thickness thinner than that of the peripheral portion thereof and slightly swell up along the swelling portions A of the thick-film resistive element 6. Accordingly, cracks may be generated at the portions B and may grow toward the thick-film resistive element 6. When the thick-film resistive element 6 has the cracks therein, its value of resistance deviates from the target value thereof, resulting in decrease in reliability. This kind of problem occurs in the so-called green sheet lamination method as well.

SUMMARY OF THE INVENTION

The present invention is made in view of the above problems. An object of the present invention is to reduce an entire area of a multilayer substrate. Another object of the present invention is to prevent cracks from being produced in a multilayer substrate due to residual stress generated by a firing step. Still another object of the present invention is to provide a method of manufacturing the multilayer substrate realizing the above objects.

Briefly, in a multilayer substrate of the present invention, a passive circuit element is disposed above an insulating base substrate, and an insulating member is disposed on the insulating base substrate with the passive circuit member interposed therebetween. A via hole is formed through the insulating member to expose a part of the passive circuit element and a terminal electrode is disposed in the via hole.

Accordingly, the terminal electrode is disposed on the passive circuit element without expanding from the passive circuit element in a direction parallel to the surface of the base substrate, so that the entire area of the multilayer substrate can be reduced. Because the passive circuit element has no overlapping portion partially overlapping with another layer, residual stress hardly concentrates on the passive circuit element, so that the passive circuit element is prevented from having cracks therein.

The insulating base substrate can have a base substrate and an insulating layer disposed on the substrate. In this case, the passive circuit element is disposed on the insulating layer. The insulating base substrate can be composed of a plurality of green sheets laminated with one another. In this case, the insulating member is also composed of a green sheet.

The multilayer substrate described above is manufactured by steps of: disposing a passive circuit element material at a specific portion on the insulating base substrate or on the insulating layer disposed on the base substrate; firing the passive circuit element material to form the passive circuit element; disposing an insulating material to cover the passive circuit element and to have a via hole for exposing the passive circuit element therefrom; firing the insulating material to form a thick-film insulating layer on the passive circuit element; filling the via hole with a conductive material; and firing the conductive material to form a terminal electrode in the via hole.

The thick-film insulating layer can be formed by repeating the steps of disposing and firing the insulating material. The passive circuit element may be a resistive element. In this case, preferably, a step of trimming the resistive element is performed after the steps of disposing and firing the insulating material are carried out at least one time, respectively. Accordingly, a value of resistance of the resistive element can be precisely controlled.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENTS (First Embodiment)

Figure 1:
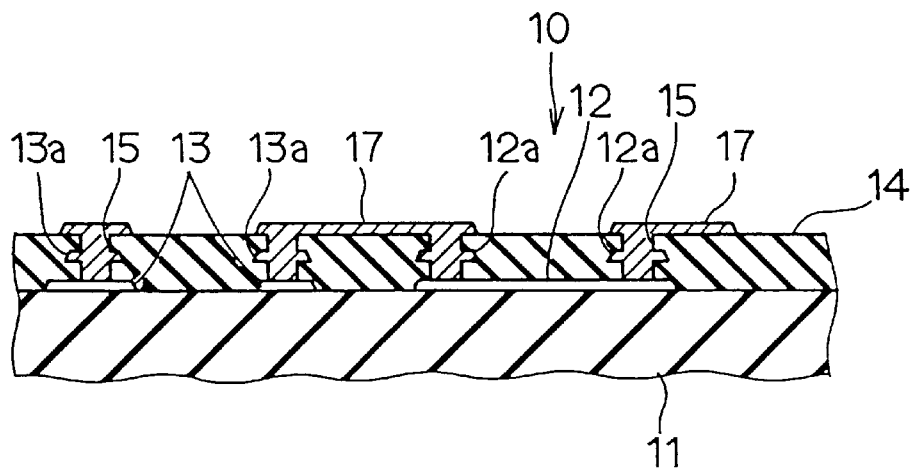
FIG. 1 is a cross-sectional view partially showing a multilayer wiring substrate in a first preferred embodiment.
Figure 2:
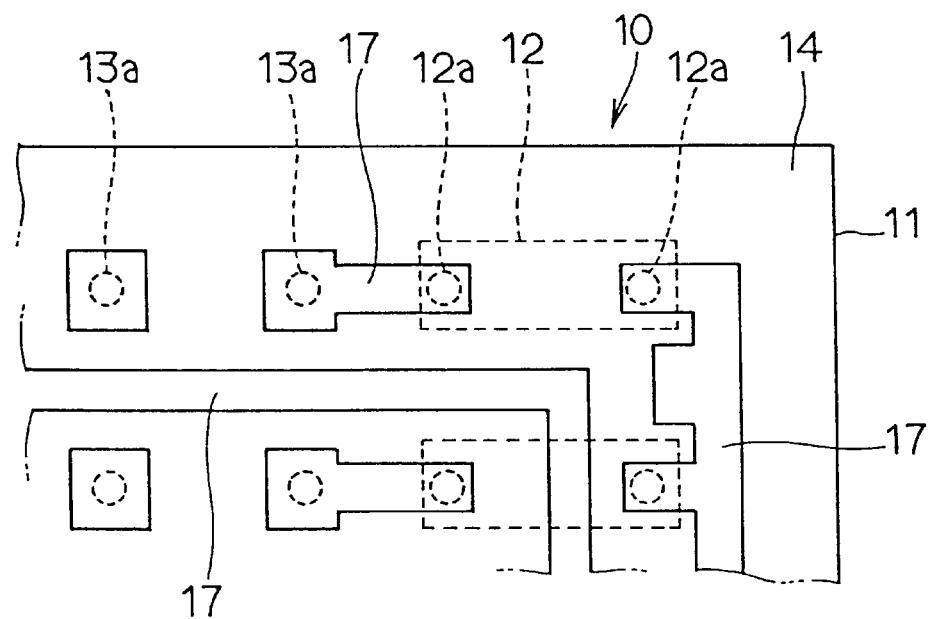
FIG. 2 is a plan view partially showing the multilayer wiring substrate of FIG. 1.

Referring to FIGS. 1, 2, a thick-film multilayer wiring substrate 10 in a first preferred embodiment has an insulating substrate 11 for serving as a base, which is made of inorganic material such as alumina, aluminum nitride (AlN), or silicon carbide (SiC). A thick-film resistive element (passive circuit element) 12 and a plurality of inside conductive patterns 13 are formed on the upper surface of the insulating substrate 11. The inside conductive patterns preferably include one of silver (Ag) and copper (Cu). When the inside conductive patterns 13 include Ag, the thick-film resistive element 12 preferably includes ruthenium oxide ($RuO_2$). When the inside conductive patterns 13 include Cu, the thick-film resistive element 12 preferably includes at least one of lanthanum boride ($LaB_6$) and tin oxide ($SnO_2$).

A thick-film insulating layer (insulating member) 14 is laminated with the insulating substrate 11 through the thick-film resistive element 12 and the inside conductive patterns 13. Accordingly, the thick-film resistive element 12 is disposed within the multilayer wiring substrate 10. The thick-film insulating layer 14 is made of inorganic material such as glass system material, ceramic system material, or glass-ceramic system material. A plurality of via-holes 15 are formed to penetrate the insulating layer 14 and to expose both end portions (corresponding to terminal portions) of the thick-film resistive element 12 and specific portions of the inside conductive patterns 13.

Then, terminal electrodes 12a, 13a for the thick-film resistive element 12 and for the inside conductive patterns 13 are respectively formed in the via-holes 15 to electrically communicate with the thick-film resistive element 12 and the inside conductive patterns 13, respectively. Further, surface conductive patterns 17 are formed on the insulating layer 14. If necessary, the surface conductive patterns 17 may be plated with copper, nickel, or gold. Further, electrical components (not shown) such as IC chips and chip components are mounted on the thus constructed multilayer wiring substrate 10. The electrical components can be covered with a protective overcoat glass, if necessary.

Figure 3A:
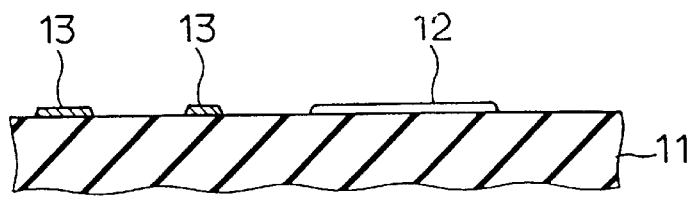
FIGS. 3A–3F are cross-sectional views that illustrate a method of manufacturing the multilayer wiring substrate of FIG. 1 in a stepwise manner.

Next, a method of manufacturing the multilayer wiring substrate 10 will be explained with reference to FIGS. 3A to 3F. First, as shown in FIG. 3A, in an element formation step, resistive paste (thick-film paste material) for the thick-film resistive element 12 and conductive paste for the inside conductive patterns 13 are successively printed on the insulating substrate 11 and are baked. Accordingly, the thick-film resistive element 12 and the inside conductive patterns 13 are formed. In this embodiment, although the printed resistive paste and conductive paste are simultaneously baked to simplify the step, they may be separately baked in respective firing steps.

Figure 3B:
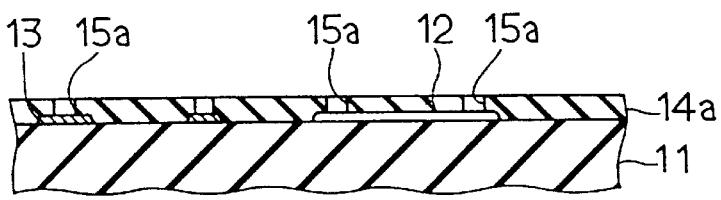
Figure 3C:
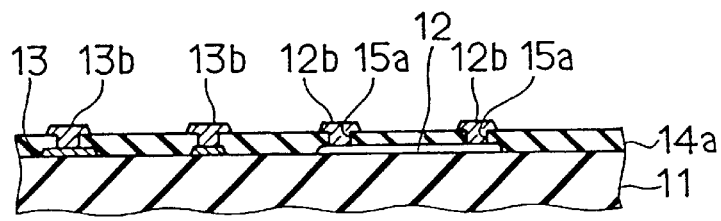
Figure 13:
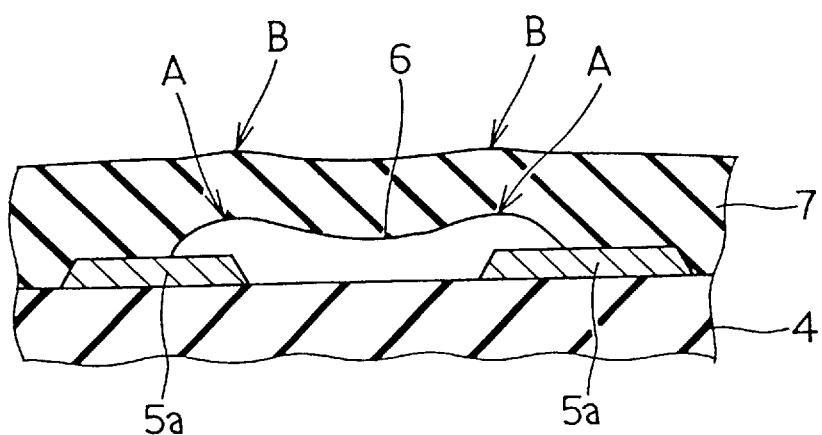
FIG. 13 is a cross-sectional view partially showing the multilayer wiring substrate in the prior art.
Figure 14A:
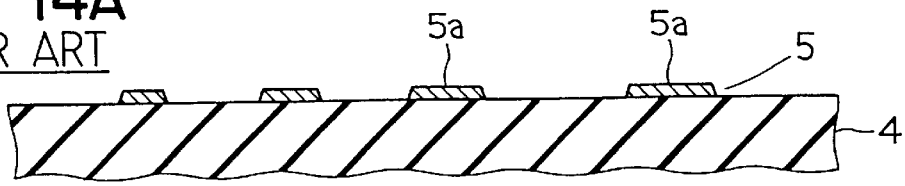
FIGS. 14A–14D are cross-sectional views that illustrate a method of maunufacturing the multilayerl wiring substrate of FIG. 13 in a stepwise manner.
Figure 14B:
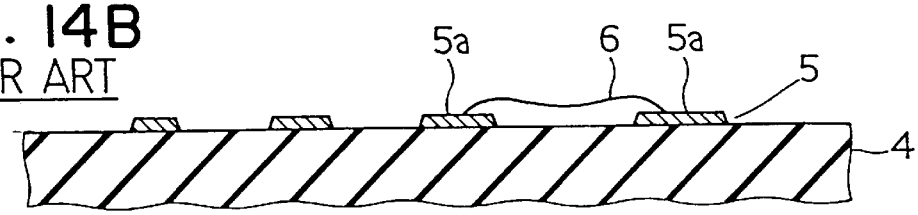
Figure 14C:
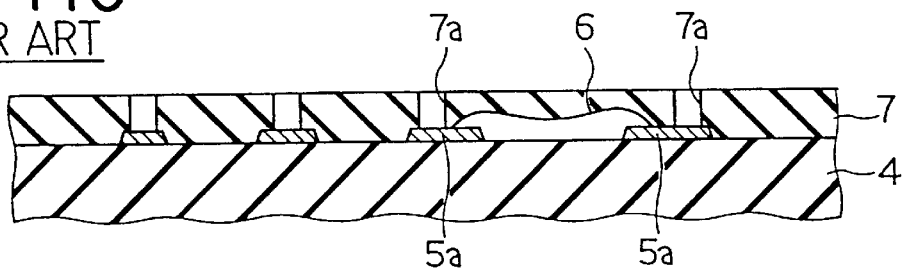
Figure 14D:
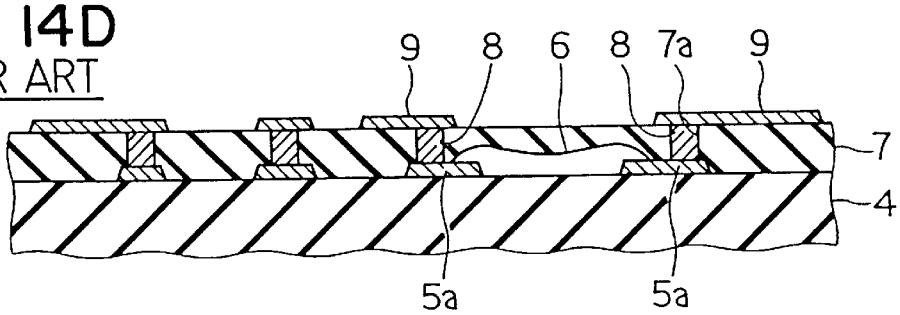

Next, as shown in FIG. 3B, in an insulating layer formation step, insulating paste including for example glass is printed on the insulating substrate 11 to form a plurality of via holes 15a for exposing the both end portions of the resistive element 12 and the specific portions of the inside conductive patterns 13. Then the printed insulating paste is baked. Accordingly, an insulating layer lower part 14a of the insulating layer 14 is formed on the insulating substrate 11. Then, as shown in FIG. 13C, in a first electrode formation step, the via holes 15a penetrating the insulating layer lower part 14a is filled with the conductive paste by printing, and the conductive paste in the via holes 15a is baked. Accordingly, terminal electrode lower parts 12b, 13b of the terminal electrodes 12a, 13a are respectively formed in the insulating layer lower part 14a.

Figure 3D:
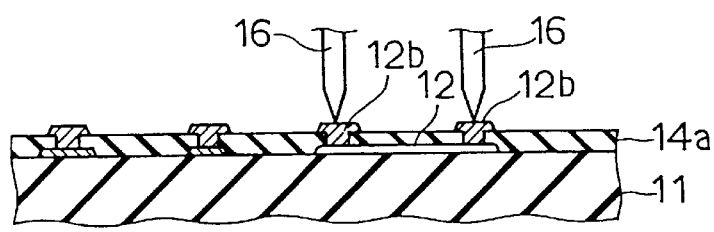

After the first insulating layer formation step or after the first electrode formation step, a trimming step is carried out to adjust a value of resistance of the thick-film resistive element 12. FIG. 3D schematically show the trimming step which is carried out after the first insulating formation step as an example. In the trimming step, the value of resistance of the thick-film resistive element 12 is adjusted by laser trimming while being measured by a pair of probes contacting a pair of the terminal electrode lower parts 12a, which are provided on the both end portions of the thick-film resistive element 12. At that time, a part of the insulating layer lower part 14a is removed. As a technique for trimming the thick-film resistive element 12, a sand-blast trimming, a pulse trimming or the like may be utilized in stead of the laser trimming technique. When the pulse trimming technique is adopted, even in a state where the thick-film resistive element 12 is covered with another layer, the resistive element 12 can be trimmed so that the value of resistance of the resistive element 12 is controlled.

Figure 3E:
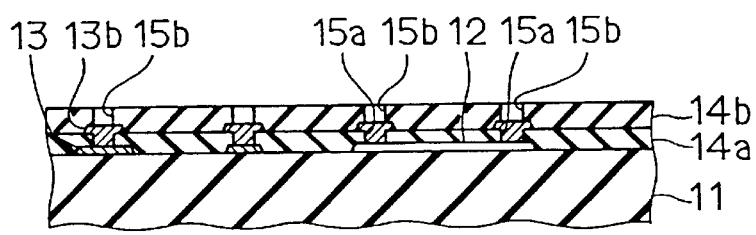

After the trimming step is carried out, as shown in FIG. 3E, in a second insulating layer formation step, the insulating paste is printed on the insulating layer lower part 14a to have a plurality of via holes 15b at positions corresponding to the via holes 15a, and then is baked. Accordingly, an insulating layer upper part 14b having the via holes 15b therein is formed on the insulating lower part 14a. In the this embodiment, in this way, the insulating layer 14 is formed by the first and second insulating layer formation steps, i.e., by repeating the formation step twice. Because of this, the insulating paste can be printed without having babbles therein, so that insulating reliability of the insulating layer 14 is increased. Although the insulating layer 14 is formed by performing the formation step twice in this embodiment, it may be formed by performing the formation step more than twice in order to further improve the insulating reliability.

Figure 3F:
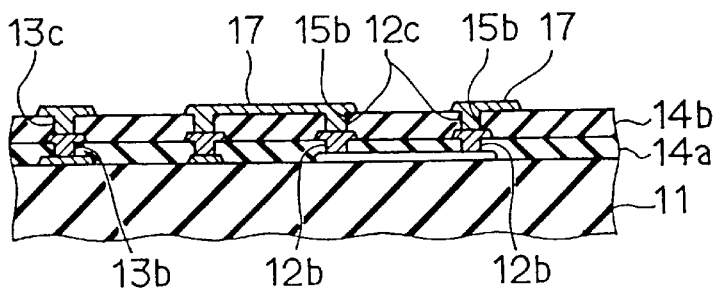

Subsequently, as shown in FIG. 3F, in a second electrode formation step, the conductive paste is printed on the insulating layer upper part 14b to fill the via holes 15b and to form the surface conductive patterns 17 and then is baked. Accordingly, terminal electrode upper parts 12c, 13c, and the surface conductive patterns 17 are formed. Consequently, the thick-film multilayer wiring substrate 10 shown in FIG. 1 is completed.

In this embodiment, the firing operation in each step described above is performed by the so-called air firing step. In accordance with that, the conductive paste includes noble metal system material such as silver (Ag), or Ag—platinum (Pt) system material, and the resistive paste includes ruthenium (Ru) system material.

Figure 12:
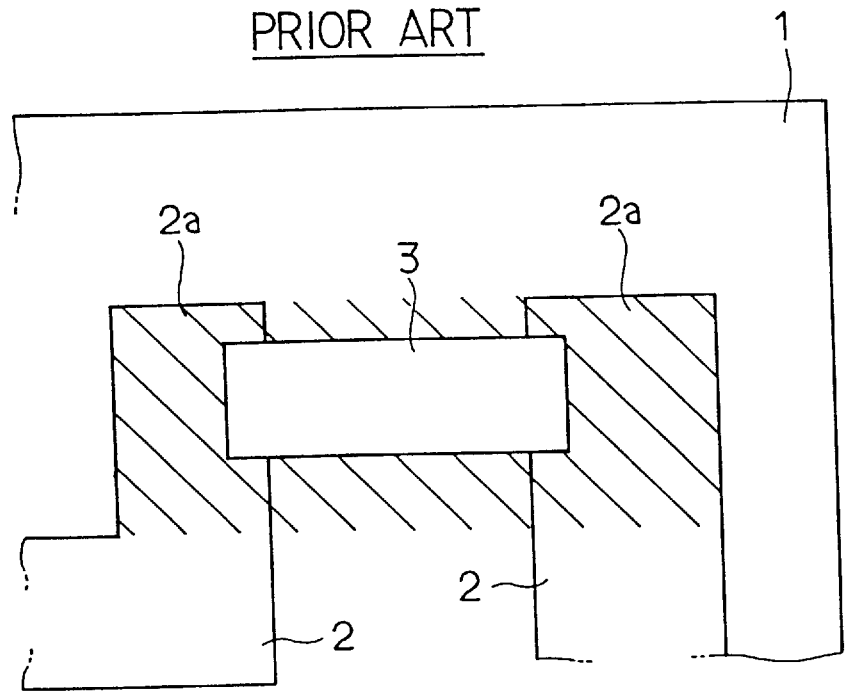
FIG. 12 is a plan view partially showing a part of a multilayer wiring substrate in a prior art.

The terminal electrodes 12a for the thick-film resistive element 12 are formed by filling the via holes 15 with the conductive paste and by firing the conductive paste in the via holes 15. Therefore, the terminal electrodes 12a and the thick-film resistive element 12 are disposed in a three-dimensional state. As shown in FIG. 2, the terminal electrodes 12a can be formed just above the thick-film resistive member 12 without expanding from the thick-film resistive element 12 in a direction parallel to the surface of the insulating film 14. As a result, the entire area of the multi-layer wiring substrate 10 can be reduced as compared to that shown in FIG. 12.

The thick-film resistive element 12 is directly formed on the insulating substrate 11 without any layers interposed therebetween. Therefore, the thick-film resistive element 12 does not swell up due to an overlapping portion with another layer as in the conventional structure shown in FIG. 13. Therefore, even when a residual stress is generated due to a difference in thermal expansion coefficient between the insulating layer 14 and the thick-film resistive element 12 after the firing steps of the first and second insulating layer formation steps, it is difficult for the residual stress to concentrate on a part of the thick-film resistive element 12.

As a result, the thick-film resistive element 12 is prevented from having cracks therein.

Also, in this embodiment, the trimming step for the thick-film resistive element 12 is carried out at a state where the insulating layer lower part 14a and the terminal electrode lower parts 12b are respectively formed in the first insulating layer formation step and in the first electrode formation step, i.e., in a state where the thickness of the insulating layer is relatively thin. Therefore, it is easy to perform the trimming step. Incidentally, the value of resistance of the resistive element 12 is easily increased during the firing step of the insulating layer 14 by invasion of components from the insulating layer 14 into the resistive element 12 or reaction between components of the resistive element 12 and the insulating layer 14. Therefore, in this embodiment, the trimming step for the resistive element 12 is performed after the insulating layer lower part 14a is formed.

That is, generally, in the case where the thick-film insulating layer 14 is formed by performing the formation step several times, the change in resistance of the thick-film resistive element 12 is largely effected by the formation step for forming the first layer directly contacting the thick-film resistive element 12, and is hardly effected by the subsequent formation steps for forming the upper layers than the first layer. Therefore, when the trimming step for the thick-film resistive element 12 is carried out after the insulating layer lower part 14a is formed as in the first embodiment, the value of resistance of the thick-film resistive element 12 is prevented from largely deviating from its initial value after the trimming step. In addition, because the thickness of the insulating layer lower part 14a is relatively thin as mentioned above, the trimming step is readily performed.

In the first embodiment, the trimming step is performed after the terminal electrode lower parts 12b are formed; however, it may be performed immediately after the insulating layer lower part 14a is formed. In this case, the probes 16 directly contacts the both end portions of the thick-film resistive element 12 to measure the value of resistance.

(Second Embodiment)

Figure 4:
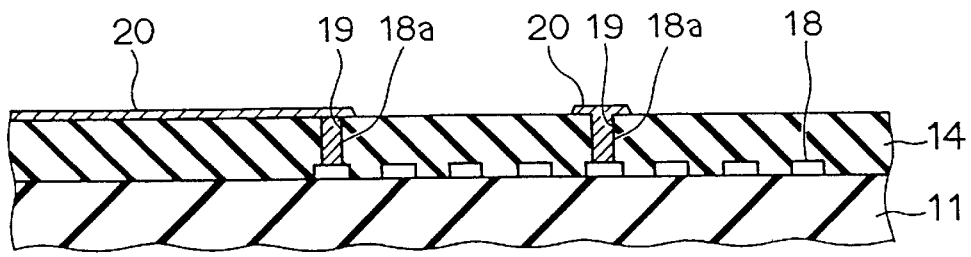
FIG. 4 is a cross-sectional view partially showing a multilayer wiring substrate in a second preferred embodiment.
Figure 5:
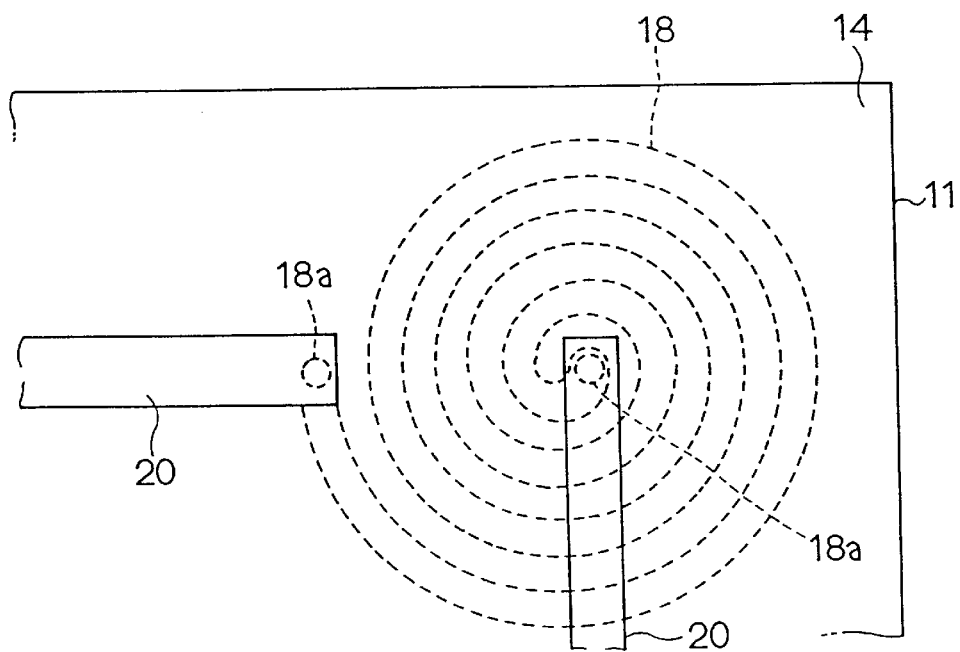
FIG. 5 is a plan view partially showing the multilayer wiring substrate of FIG. 4.

FIGS. 4, 5 show a second preferred embodiment, and herebelow only points different from the first embodiment will be explained. The same parts as in the first embodiment are indicated with the same reference numerals.

That is, in the second embodiment, a spiral thick-film resistive element 18 is formed on the insulating substrate 11 by printing and firing steps of resistive paste. In this case, the insulating layer 14 formed on the insulating substrate 11 through the thick-film resistive element 18 is formed with a pair of via holes 19 opening at the both end portions (corresponding to terminal portions) of the thick-film resistive element 18. Terminal electrodes 18a for the thick-film resistive element 18 for filling in the via holes 19 and surface conductive patterns 20 are simultaneously formed in and on the insulating layer 14 by printing and firing steps using conductive paste.

According to this embodiment, a surge withstand property of the thick-film resistive element 18 is improved. That is, generally, field intensity E applied to a resistor is expressed by formula; $E=V/L$, in which L represents a length of the resistor and V represents an applied voltage. Therefore, as in this embodiment, when the length of the thick-film resistive element 18 becomes long, the surge withstand property of the thick-film resistive element 18 becomes large. In addition, when a large value of resistance is required for the thick-film resistive element 18, an area necessary for arranging the thick-film resistive element 18 is relatively small. The other features and effects are the same as those in the first embodiment.

(Third Embodiment)

Figure 6:
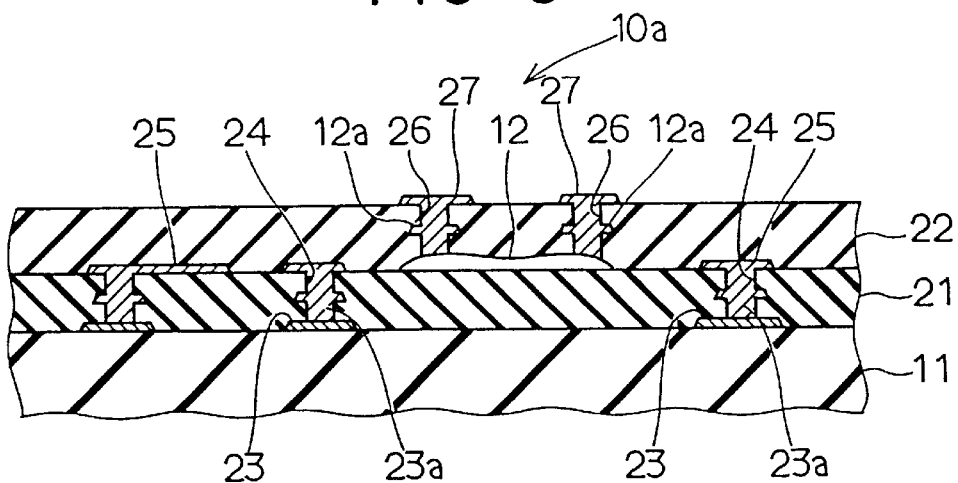
FIG. 6 is a cross-sectional view partially showing a multilayer wiring substrate in a third preferred embodiment.

FIG. 6 shows a third preferred embodiment, and only points different from the first embodiment will be explained. That is, the third embodiment is most characterized in that two thick-film insulating layers 21, 22 are laminated on the insulating substrate 11 to form a thick-film multilayer wiring substrate 10a. Specifically, referring to FIG. 6, a plurality of inside conductive patterns 23 are formed directly on the upper surface of the insulating substrate 11 by printing and firing steps using conductive paste. The thick-film resistive element may be directly formed on the upper surface of the insulating substrate 11. The thick-film insulating layer 21 made of inorganic material is then formed on the insulating substrate 11 with the inside conductive patterns 23 interposed therebetween by printing and firing steps.

A plurality of via holes 24 are formed in the thick-film insulating layer 21 to expose specific portions of the inside conductive patterns 23, and the thick-film resistive element 12 is formed on the thick-film insulating layer 21 by printing and firing steps using resistive paste. Further, terminal electrodes 23a are formed in the thick-film insulating layer 21 to fill the via holes 24, and at the same time inside conductive patterns 25 are formed on the thick-film insulating layer 21. The thick-film insulating layer 22 made of the same inorganic material as that of the thick-film insulating layer 21 is then formed on the thick-film insulating layer 21 through the inside conductive patterns 25 and the resistive element 12. Accordingly, the thick-film resistive element 12 is disposed within the multilayer wiring substrate 10a. In this case, a plurality of via holes 26 are formed in the thick-film insulating layer 22 to expose the both end portions (corresponding to terminal portions) of the thick-film resistive element 12 therefrom.

The terminal electrodes 12a for the thick-film resistive element 12 are then formed in the via holes 26 and surface conductive patterns 27 are formed on the thick-film insulating layer 22 by printing and firing steps using conductive paste. Incidentally, it is desirable for each of the thick-film insulating layers 21, 22 to be formed by performing a formation step for more than two times. The other features and effects are the same as those in the first embodiment.

(Fourth Embodiment)

Figure 7:
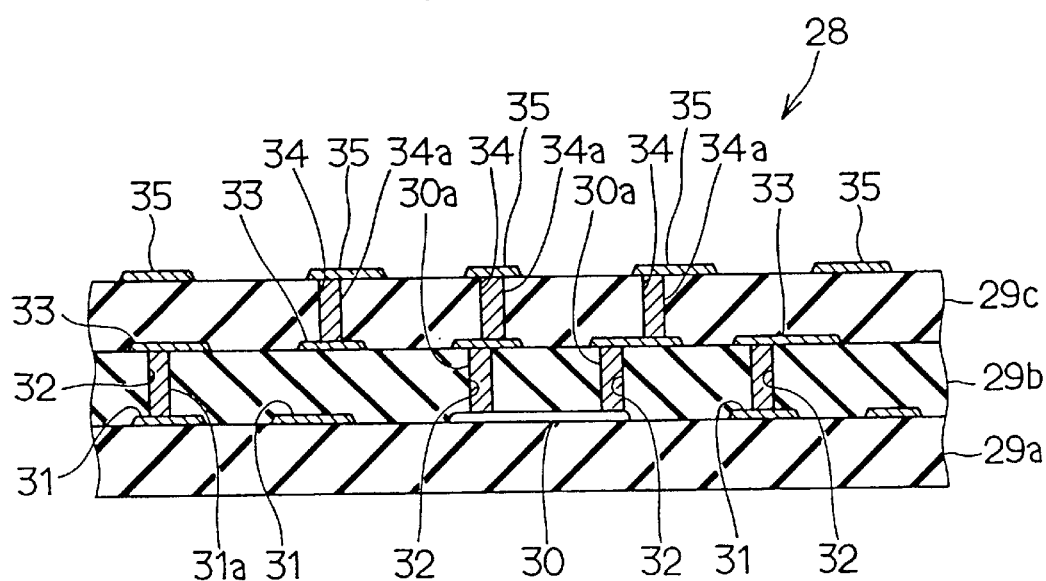
FIG. 7 is a cross-sectional view partially showing a multilayer wiring substrate in a fourth preferred embodiment.

FIG. 7 shows a fourth preferred embodiment, and only points different from the first embodiment will be explained. In the fourth embodiment, a multilayer wiring substrate 28 is formed from well-known green sheets. Specifically, the multilayer wiring substrate 28 is composed of three insulating layers 29a–29c laminated with one another. A thick-film resistive element (passive circuit element) 30 and inside conductive patterns 31 are disposed on the insulating layer 29a as the lowermost layer. The thick-film resistive element 30 in this embodiment is preferably formed from alumina powder and metallic material such as tungsten (W) or molybdenum (Mo).

The insulating layer 29b as an intermediate layer is formed to have a plurality of via holes 32 for exposing the both end portions (corresponding to terminal portions) of the thick-film resistive element 30 and specific portions of the inside conductive patterns 31. The via holes 32 are filled with terminal electrodes 30a for the thick-film resistive element 30 and terminal electrodes 31a for the inside conductive patterns 31. Inside conductive patterns 33 are further formed on the insulating layer 29b. Some of the surface conductive patterns 33 are connected to the terminal electrodes 30a, 31a.

The insulating layer 29c as the uppermost layer is formed to have a plurality of via holes 34 for exposing specific portions of the inside conductive patterns 33, and conductive fills 34a are formed to fill the via holes 34. Further, surface conductive patterns 35 are formed on the upper surface of the insulating layer 39c. Some of the surface conductive patterns 35 are connected to the conductive fills 34a.

The multilayer wiring substrate 28 described above is manufactured by the following steps. That is, resistive paste for the thick-film resistive element 30 and conducive paste for the inside conductive patterns 31 are printed on a green sheet which is to be the insulating layer 29a. The via holes 32, 34 are formed in respective green sheets for the insulating layers 29b, 29c by a punching step, and the terminal electrodes 31a, the inside conductive patterns 33, the conducive fills 34a, and the surface conductive patterns 35 are printed on and in the respective green sheets having the via holes 32. Thereafter, the tree green sheets are laminated with one another and are hot-pressed. In this state, after the laminated green sheets are cut into a shape corresponding to the multilayer wiring substrate 28, it is baked. If necessary, the surface conductive patterns 35 are plated with copper, nickel, gold or the like. As a result, the multilayer wiring substrate 28 is completed. The other features and effects are the same as those in the first embodiment.

(Other Embodiments)

Figure 8:
FIG. 8 is a circuit diaphragm of resistors in a modified embodiement of the first embodiment.
Figure 9:
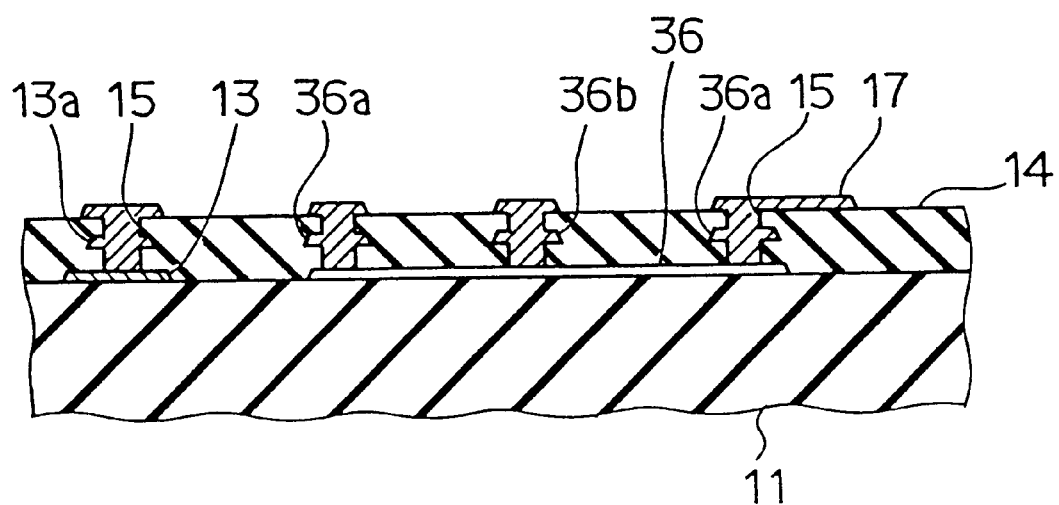
FIG. 9 is a cross-sectional view partially showing a multilayer wiring substrate for realizing the circuit diaphragm of FIG. 8 therein.

As a modified example of the first embodiment, when a resistive pattern in which resistors R1, R2 are electrically connected in series as shown in FIG. 8 is formed in the multilayer wiring substrate, the following structure can be adopted. That is, as shown in FIG. 9, a thick-film resistive element (passive circuit element) 36 formed between the insulating substrate 11 and the thick-film insulating layer 14 has a pair of terminal electrodes 36a at the both end portions thereof and a terminal electrode 36b at a position capable of dividing a value of resistance of the resistive element 36 into two values of resistance corresponding to the resistors R1, R2.

Figure 10:
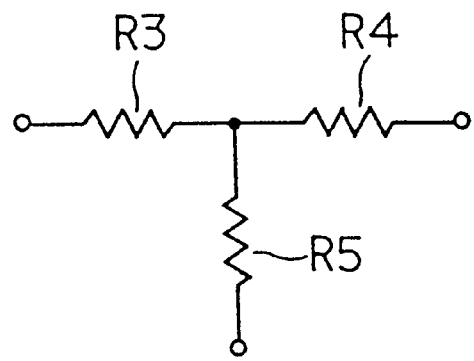
FIG. 10 is a circuit diaphragm of resistors in another modified embodiment of the first embodiment.
Figure 11:
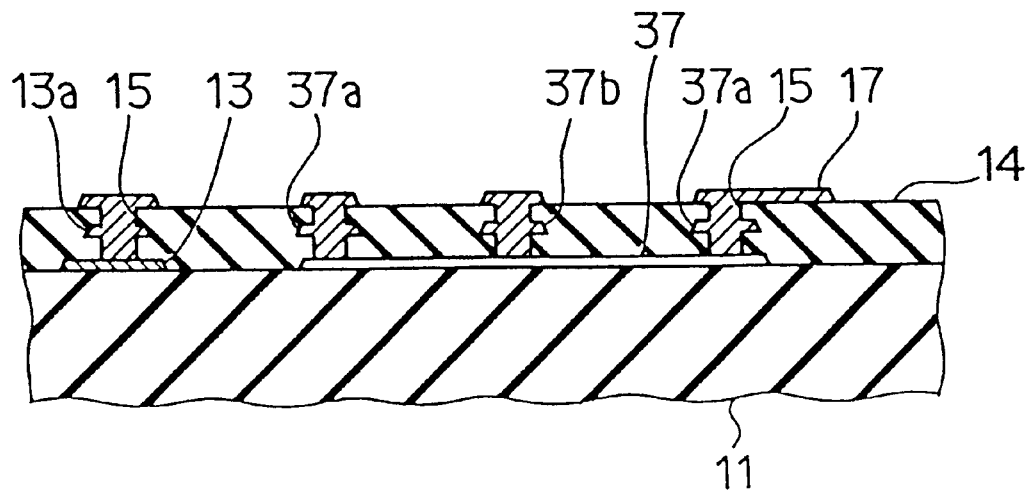
FIG. 11 is a cross-sectional view partially showing a multilayer wiring substrate for realizing the circuit diaphragm of FIG. 10 therein.

Also, when a resistive pattern in which resistors R3, R4, R5 are electrically connected as shown in FIG. 10 is formed, the structure of the first embodiment may be modified as shown in FIG. 11. That is, a pair of terminal electrodes 37a are formed at the both end portions of a thick-film resistive element (passive circuit element) 37. Additionally, another via hole is formed in the insulating layer 14 to expose the thick-film resistive element 37 at a position capable of dividing the value of resistance of the resistive element 37 into two values of resistance corresponding to the resistors R3, R4, and the via hole is filled with a resistive member 37b for the resistor R5.

In the above two cases, the terminal electrodes 36b and the resistive member 37b are also formed by printing and firing pastes. The structures shown in FIGS. 9, 11 including the terminal electrode 36b and the resistive element 37b may be adopted to the other embodiments. For example, when the terminal electrode 36b or the resistive element 37b is applied to the fourth embodiment disclosing the green sheet lamination substrate, after the paste for the terminal electrode 36b or the resistive element 37b is embedded in the corresponding green sheet, all of the green sheets are laminated and are baked together.

In the above-mentioned embodiments, although the thick-film resistive element is disposed within the multilayer wiring substrate as a passive circuit element, the passive circuit element is not limited to that and may be a inductor element or a capacitor element formed from a thick-film paste material. While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a circuit substrate, the method comprising steps of:

disposing a passive circuit element material at a specific portion on an insulating base substrate;

firing the passive circuit element material to form a passive circuit element;

disposing an insulating material to cover the passive circuit element and to have a first plurality of via holes for exposing terminal portions of the passive circuit element therefrom;

firing the insulating material to form a thick-film insulating layer on the passive circuit element;

filling the first plurality of via holes with a conductive material so that the conductive material directly contact the passive circuit element at the terminal portions;

firing the conductive material to form terminal electrodes contacting the passive circuit element in the first plurality of via holes; and disposing horizontally extending conductive patterns that are vertically connected to the passive circuit element only through the first via holes, the horizontally extending conductive patterns being disposed on a surface other than a surface of the insulating base substrate on which the passive circuit element is disposed.

2. The method of claim 1, wherein:
the base substrate is composed of an insulating substrate and an insulating layer disposed on the insulating substrate; and
the passive circuit element material is disposed on the insulating layer.

3. The method of claim 1, wherein the passive circuit element is a resistive element, the method further comprising a step of trimming the resistive element while measuring a value of resistance of the resistive element, after the step of firing the passive element material.

4. The method of claim 3, wherein the value of resistance of the resistive element is measured by a probe.

5. The method of claim 3, wherein the value of resistance of the resistive element is measured through the terminal electrode.

6. The method of claim 3, wherein:
the steps of disposing and firing the insulating material are repeated more than one time; and
the step of trimming the resistive element is carried out after the steps of disposing and firing the insulating material are carried out respectively one time.

7. The method of claim 3, wherein:
the steps of disposing and firing the insulating material and filling the first plurality of via holes with the conductive material are repeated more than one time before the step of firing the conductive material; and
the step of trimming the resistive element is carried out after the steps of disposing and firing the insulating material are carried out respectively one time.

8. The method of claim 7, wherein:
the step of trimming the resistive element is carried out after the steps of disposing and firing the insulating material and filling the plurality of via holes with the conductive material are carried out one time.

9. The method of claim 1, wherein:
the insulating material has a second via hole; and
the second via hole is filled with a resistive material form a resistor in the second via hole.

10. The method of manufacturing the circuit substrate according to claim 1, wherein the passive circuit element material is disposed on the insulating base substrate in the disposing step so as to isolate the passive circuit element from another conductive element disposed on the insulating base substrate.

11. The method of manufacturing the circuit substrate according to claim 1, wherein the passive circuit element is formed to cover end openings of both the first via holes entirely.

12. A method of manufacturing a circuit substrate, the method comprising steps of:
printing a passive circuit element material on a first green sheet;
forming first via holes through a second green sheet;
filling the first via holes with a conductive material;
laminating the first and second green sheets so that the conductive material filling the first via holes directly contact the passive circuit element material printed on the first green sheet, and provide terminals for the passive circuit element material;
firing the laminated first and second green sheets; and
disposing horizontally extending conductive patterns that are vertically connected to the passive circuit element only through the first via holes, the horizontally extending conductive patterns being disposed on a surface other than a surface of the first green sheet on which the passive circuit element is disposed.

13. The method of claim 12, wherein the passive circuit material and the conductive material are in a paste state.

14. The method of claim 12, further comprising:
forming a second via hole through the second green sheet; and
filling the second via hole with a resistive material to form a resistor in the second via hole.

15. The method of manufacturing the circuit substrate according to claim 12, wherein the passive circuit element material is disposed on the first green sheet in the disposing step so as to isolate the passive circuit element from another conductive element disposed on the first green sheet.

16. The method of manufacturing the circuit substrate according to claim 12, wherein the passive circuit element is formed to cover end openings of both the first via holes entirely.

17. A method of manufacturing a circuit substrate, comprising:
printing on an insulating base substrate a passive circuit element material which forms a passive circuit element;
disposing an Insulating material to form an insulating layer which covers the passive circuit element, said insulating layer having a first via hole and a second via hole which expose a first portion and a second portion of said passive circuit element, respectively, and are filled with conductive materials, whereby the respective conductive materials directly contact the passive circuit element at the first and second portions to form terminal electrodes of the passive circuit element; and
disposing horizontally extending conductive patterns that are vertically connected to the passive circuit element only through the via holes, the horizontally extending conductive patterns being disposed on a surface other than a surface of the insulating base substrate on which the passive circuit element is disposed; wherein:
said insulating material is disposed by:
printing the insulating material with the first and second via holes on the insulating base substrate with the passive circuit element interposed therebetween;
firing the printed insulating material to form the insulating layer;
filling the first and second via holes with the conductive materials; and
firing the conductive materials to form the terminal electrodes of the passive circuit element in the first and second via holes.

18. The method of claim 17, further comprising trimming the passive circuit element after the conductive materials are fired.

19. The method of claim 18, wherein said passive circuit element is a resistive element, said method including carrying out said trimming while measuring a resistance value of the resistive element through the terminal electrodes.

20. The method of claim 18, further comprising:
printing an upper insulating material to cover the insulating layer; and
firing the printed upper insulating material to form an upper insulating layer.

21. The method of manufacturing the circuit substrate according to claim 17, wherein the passive circuit element material is disposed on the insulating base substrate in the disposing step so as to isolate the passive circuit element from another conductive element disposed on the insulating base substrate.

22. A method of manufacturing a circuit substrate, the method comprising steps of:
disposing a passive circuit element material at a specific portion on an insulating base substrate;
firing the passive circuit element material to form a passive circuit element;
disposing an insulating material to cover the passive circuit element and to have a via hole for exposing a part of the passive circuit element therefrom;
firing the insulating material to form a thick-film insulating layer on the passive circuit element;
filling the via hole with a conductive material so that the conductive material directly contact the passive circuit element;
firing the conductive material to form a terminal electrode contacting the passive circuit element in the first via hole; wherein:
the passive circuit element is a resistive element, the method further comprising a step of trimming the resistive element while measuring a value of resistance of the resistive element, after the step of firing the passive element material;
the steps of disposing and firing the insulating material and filling the via hole with the conductive material are repeated more than one time before the step of firing the conductive material; and
the step of trimming the resistive element is carried out after the steps of disposing and firing the insulating material are carried out respectively one time.

23. The method of claim 22, wherein the step of trimming the resistive element is carried out after the steps of disposing and firing the insulating material and filling the via hole with the conductive material are carried out one time.

24. A method of manufacturing a circuit substrate, the method comprising steps of:
disposing a passive circuit element material at a specific portion on an insulating base substrate;
firing the passive circuit element material to form a passive circuit element;
disposing an insulating material to cover the passive circuit element and to have a first via hole for exposing a part of the passive circuit element therefrom;
firing the insulating material to form a thick-film insulating layer on the passive circuit element;
filling the first via hole with a conductive material so that the conductive material directly contact the passive circuit element;
firing the conductive material to form a terminal electrode contacting the passive circuit element in the first via hole; wherein:
the insulating material has a second via hole; and
the second via hole is filled with a resistive material to form a resistor in the second via hole.

25. A method of manufacturing a multilayer substrate for a hybrid integrated circuit, the method comprising steps of:
printing a passive circuit element material on a first green sheet;
forming a first via hole through a second green sheet;
filling the first via hole with a conductive material;
laminating the first and second green sheets so that the conductive material filling the first via hole entirely contacts the passive circuit element material printed on the first green sheet;
firing the laminated first and second green sheets;
forming a second via hole through the second green sheet; and
filling the second via hole with a resistive material to form a resistor in the second via hole.

26. A method of manufacturing a circuit substrate, comprising:
printing on an insulating base substrate a passive circuit element material which forms a passive circuit element; and
disposing an insulating material to form an insulating layer which covers the passive circuit element, said insulating layer having a first via hole and a second via hole which expose a first portion and a second portion of said passive circuit element, respectively, and are filled with conductive materials, whereby the respective conductive materials directly contact the passive circuit element at the first and second portions to form terminal electrodes of the passive circuit element; wherein:
said insulating material is disposed by:
printing the insulating material with the first and second via holes on the insulating base substrate with the passive circuit element interposed therebetween;
firing the printed insulating material to form the insulating layer;
filling the first and second via holes with the conductive materials;
firing the conductive materials to form the terminal electrodes of the passive circuit element in the first and second via holes; and
trimming the passive circuit element after the conductive materials are fired.

27. The method of claim 26, wherein said passive circuit element is a resistive element, said method including carrying out said trimming while measuring a resistance value of the resistive element through the terminal electrodes.

28. The method of claim 26, further comprising:
printing an upper insulating material to cover the insulating layer; and
firing the printed upper insulating material to form an upper insulating layer.

* * * * *